United States Patent [19]
Westphal et al.

[11] Patent Number: 5,343,148
[45] Date of Patent: Aug. 30, 1994

[54] GRADIENT COIL SYSTEM

[75] Inventors: Michael Westphal, Offenbach; Bertold Knüttel, Rheinstetten-Mörsch; Hartmut Schmidt, Karlsruhe, all of Fed. Rep. of Germany

[73] Assignee: Bruker Analytische Mebtechnik GmbH, Fed. Rep. of Germany

[21] Appl. No.: 992,901

[22] Filed: Dec. 16, 1992

[30] Foreign Application Priority Data

Dec. 20, 1991 [DE]  Fed. Rep. of Germany ....... 4142263

[51] Int. Cl.$^5$ .............................................. G01R 33/20
[52] U.S. Cl. ........................................ 324/309; 324/318
[58] Field of Search ............... 324/300, 307, 309, 310, 324/311, 312, 313, 314, 318, 322; 128/653.5

[56] References Cited

U.S. PATENT DOCUMENTS 5,045,792  9/1991  Mehdizadeh ...................... 324/318

FOREIGN PATENT DOCUMENTS

| | | |
|---|---|---|
| 0108421 | 8/1983 | European Pat. Off. . |
| 0160350 | 10/1985 | European Pat. Off. . |
| 0216590 | 9/1986 | European Pat. Off. . |
| 0320285 | 12/1988 | European Pat. Off. . |
| 0399789 | 5/1990 | European Pat. Off. . |
| 0433002 | 12/1990 | European Pat. Off. . |
| 3133873 | 8/1981 | Fed. Rep. of Germany . |

OTHER PUBLICATIONS

"Highly Linear Asymmetric Transverse Gradient Coil Design for Head Imaging": Myers & Roemer.

*Primary Examiner*—Michael J. Tokar
*Attorney, Agent, or Firm*—Walter A. Hackler

[57] ABSTRACT

In an NMR apparatus with a system of gradient coils for the production of a magnetic field gradient within a measurement volume (1) within a field coil, the transverse gradient coils are constructed unsymmetrically with respect to the $z=0$ plane dividing the measurement volume (1), however largely mirror symmetric to a $x=0$ or $y=0$ plane containing the z axis, and possess only two partial coils (20', 20''; 40', 40'') whose windings each exhibit the same winding direction. The axial gradient coils are cylindrically symmetric with respect to the z axis and totally unsymmetric with respect to the $z=0$ plane, and consist of at least two partial coils which are arranged on differing sides of $z=0$ plane, whereby the partial coils on one side largely exhibit the opposite winding direction than the coils on the other side, and whereby the number of coils with a particular winding direction is not equal to the number of coils with the opposite winding direction. In each case, it is thereby achieved that the measurement volume (1) is displaced to a, relative to the z axis, axial end of the apparatus so that access to the measurement volume (1) is substantially improved.

16 Claims, 7 Drawing Sheets

PRIOR ART

PRIOR ART

GRADIENT COIL SYSTEM

FIELD OF THE INVENTION

The invention concerns an apparatus for the production of nuclear magnetic resonance (NMR) with a field coil for the production of a homogeneous magnetic field $B_z$ in the direction of a z-axis and a system of gradient coils for the production of at least one approximately constant magnetic field gradient within a measurement volume in the homogeneous region of the magnetic field produced by the field coil, whereby the system of gradient coils exhibits at least a subsystem of transverse gradient coils for the production of magnetic field gradients $G_x$ or $G_y$ in a direction x or y perpendicular to the z-axis.

BACKGROUND OF THE INVENTION

Such an NMR construction is by way of example known in the art from DE OS 31 33 873.

An important component of this type of NMR system, which is normally used for nuclear spin tomography, is a system of three gradient coils which, independent of another, are fed with currents of different strengths. These coils serve the purpose of overlapping constant field gradients of adjustable strengths upon the homogeneous magnetic field $B_0$ of the main field coil, whereby the direction of one of these gradients ($dB_z/dz$) is, as a rule, parallel to the direction of the homogeneous main field $B_{0z}$, that is to say, to the axis of the main field magnet (z gradient=axial gradient) and the directions of the two other gradients ($dB_z/dx$, $dB_z/dy$) run orthogonal thereto and with respect to each other transverse to the direction of the main field (x and y gradients=transverse gradients). The spatial region in which the magnetic field of these gradient coils runs approximately linearly can be utilized for spatially resolved NMR methods (imaging, position selective spectroscopy) in so far as this region is not further limited through inhomogeneities of the main field. The gradient coils are, as a rule, attached to a cylindrical support pipe which surrounds the patient.

Due to the geometric configuration of conventional gradient coils, the support pipe has an axial extent to both sides of the center of the linear region which assumes a value of 0.6 to 1.5 times the diameter of the support pipe. With the typical value of 0.7 m for the diameter of the support pipe, this is 0.42 m to 1.05 m. The patient is therefore surrounded by a relatively long narrow pipe. With sensitive patients, this can easily lead to conditions of claustrophobia. A further disadvantage of conventional gradient coils systems is due to the fact that is is not possible, in special body investigations as by way of example the examination of the head or the extremities, to utilize gradient coils in proximity to the object since the coils, due to the large axial separation from the linear region up to the ends of the support pipe, must surround the shoulders of the patient, that is to say must have a diameter of at least 0.5 m. Gradient coils in proximity to the object with small diameters had namely the advantage of a substantially reduced inductivity for a given gradient strength per unit current, through which correspondingly smaller gradient rise times were made possible. This is particularly advantageous for the executability of modern NMR examination methods (echoplanar methods etc.).

The relatively large separation from the axial ends of a conventional gradient coil system to the center of the linear investigation region is largely caused by the geometry of the transverse gradient coils. Such a conventional coil configuration consists of 4 partial coils arranged symmetrically upon the surface of a cylinder of radius R. The coil configuration is largely mirror symmetric with respect to the z=0 plane as well as to the y=0 plane in the case of y gradient coils or to the x=0 plane in the event of x gradient coils respectively. Furthermore, both partial coils possess in the region of z<0, considering the flux direction of the electric current, a common winding direction, for example, clockwise with respect to the axis given by the gradient direction, with the two partial coils in the region of z>0 exhibiting the opposite winding direction.

Due to the mirror symmetry of such coils a magnetic field is then produced independent of the detailed guiding of the windings which has the same symmetry as the desired transverse gradient (x or y gradient), that is to say, is an even function with respect to the z=0 plane and an odd function with respect to the y=0 plane. The detailed guiding of the windings is thereby so chosen that the deviation of the z component of the magnetic field from the desired function $B_z=ay$ is small over as large a region as possible.

The undesired large axial extent of such coils is obviously caused by the "return current section" of the windings which, in order to produce a sufficiently large volume with approximately linear field dependence (by way of example with a relative deviation from ideal linear dependence of ±5% in a spherical volume with a diameter of 50% of the cylinder diameter d characterizing the gradient coil), must lie in the region of $z = \pm 0.6$ d. In view of the compromising of the linearity by return portions of the winding of relatively small distance z from the central plane, it is obvious that these portions, in the region of their axial positions, produce a gradient which is oppositely directed to the field gradient produced by the winding sections in the region of the mid-plane z=0. A large axial extent of the linear investigation region is thereby only possible with gradients whose return sections exhibit a large separation from the central plane z=0.

Towards this end it is therefore necessary that a patient, of which by way of example a tomogram of the inner skull is to be taken, be inserted head first over a long axial stretch along the z-axis into a long narrow pipe so that the head of the patient comes to rest in the measurement volume in the middle z=0 plane. In the event that the diameter d of the gradient coil, by way of example for the purpose of realizing high gradient strengths or small inductivity, is less than the shoulder width of the patient, the patient upon insertion into the magnet, would be stuck at the shoulders and the head would not be able to be brought at all into the axially distant measurement volume.

European laid open publication 0399789A2 discloses the use of a asymmetric transverse gradient coil in conjunction with fringe field imaging. In the fringe field imaging procedure, the axial gradient is generated by the inhomogeneous magnetic field at the edge of the magnet. Although these gradients can be extremely strong, their linearity is compromised. In conjunction with this system, symmetric axial gradient coils, to supplement the axial gradient of the fringe field, are disclosed. There is no mention of asymmetric shielding coils in conjunction with the system.

European laid open publication 0108421A2 discloses the use of an asymmetric axial gradient coil in conjunction with transverse coil systems for the purpose of displacing the center of the gradient region for imaging. Asymmetric transverse coils are not proposed nor are they relevant to this particular publication. The use of active shielding is discussed in Europan patent laid open publication 0433002A2 and a possible geometric configuration for asymmetric transverse gradient coils is suggested in the abstracts to the Society of Magnetic Resonance in Medicine Meeting, Aug. 1991, page 711.

In view of the above, it is therefore the purpose of the present invention to present an improved NMR apparatus that, on the one hand, compensates for patient claustrophobia while, on the other hand, allowing head examinations using an apparatus whose inner diameter clearance can be, for example, larger than the diameter of a human head, but smaller than the average shoulder width of a person.

SUMMARY OF THE INVENTION

The purpose of the invention is achieved in that the subsystem is constructed from transverse gradient coils which are not symmetric with respect to the z=0 plane dividing the measurement volume, however are largely mirror symmetric with respect to a plane x=0 or y=0 containing the z-axis which likewise divides the measurement volume and are comprised solely of two partial coils whose windings each have the same winding direction with respect to the axis given by the gradient direction. The system includes axial gradient coils arranged cylindrically symmetric with respect to the z axis and totally unsymmetric with respect to the z=0 plane and dividing the measurement volume. These axial gradient coils are comprised of at least two partial coils which are arranged on different sides with respect to the z=0 plane, whereby the partial coils on one side exhibit largely the opposite winding direction than the coils on the other side of the z=0 plane, with the number of windings of a particular winding direction being unequal to the number of windings with a winding direction of opposite sense.

In this fashion the separation $z_0$ between the patient sided end of the gradient coil system and the center of the linear investigation region is substantially reduced. The geometry of the gradient coil system is, in the apparatus in accordance with the invention, so reformed that the region of linear magnetic field and gradient dependence useful for NMR investigations can already start on the patient end side of the gradient coil system. The detailed guiding of the winding sections on the patient side is thereby so carried out that a sufficiently larger region for NMR investigations results which exhibits a field dependence with sufficiently small deviations from ideal linear gradient field dependence.

Starting from the geometry of conventional gradient coils, the geometry of the gradient coils in accordance with the invention can be derived in the following fashion:

The patient sided return section of a conventional gradient coil which, on the one hand, causes the large separation from the center of the linear region and, on the other hand, reduces in principle the size of the linear region suitable for NMR investigations, is displaced to the side turned away from the patient. The unsymmetric perturbation in the field dependence thereby resulting in the vicinity of the zone provided for NMR investigations can, on the one hand, be kept small by displacing the return section of the windings at large distances from this region and, on the other hand, this perturbation can be largely compensated for by means of detailed guiding of the winding sections on the patient side.

Through the utilization of the transverse gradient coil in accordance with the invention it is possible, in a simple manner, to achieve the above mentioned purpose, namely the reduction of the distance $z_0$ between the patient sided front side of the gradient coil system and the center of the measurement volume suitable for NMR investigations.

As a rule an apparatus for the excitation of nuclear magnetic resonances also contains a subsystem of axial gradient coils for the production of a magnetic field gradient $G_z$ in the direction of the z-axis. With the axial gradient coils, the axial extent to both sides of the center of the linear field region of the coil is less than that of transverse gradient coils. With coils of sufficient linearity, it assumes a value in general, of more than 0.44 times ($\sqrt{\frac{3}{4}}$ times) the diameter of the coil. With the gradient coils which are suitable for whole body investigations of adults, and exhibit, in general, a diameter d of 0.7 m, this is about ± 0.3 m. This value is thereby significantly smaller than that of transverse gradient coils.

In conventional axial gradient coils the windings of the coils are arranged in a cylindrically symmetric fashion on the surface of a cylinder of radius R about the z axis. The configuration of the windings is as a rule, taking into consideration the direction of the current, anti-symmetric with respect to the z=0 plane. The detailed configuration of the windings is, as in the case of the transverse gradient coils, so arranged that as large a volume as possible results with a field dependence whose deviation from the ideal dependence $B_z=az$ is sufficiently small.

When utilizing the transverse gradient coils in accordance with the invention and conventional axial gradient coils, the above mentioned separation $z_0$ between the patient sided front side of the gradient coil system and the center of the measurement volume suitable for NMR investigations is as a rule determined by the axial extent of the axial gradient coils.

To accomplish the purpose of the invention, a geometric change in configuration of the axial gradient coils is therefore provided for in such a manner that the axial gradient coils are arranged cylindrically symmetrically with respect to the z axis and completely unsymmetrically with respect to the z=0 plane dividing the measurement volume, and that the axial gradient coils are comprised of at least two partial coils which are arranged on different sides with respect to the z=0 plane, whereby the partial coils on one side exhibit essentially the opposite winding direction than the partial coils on the other side of the z=0 plane, and whereby the number of windings with a certain winding sense is not equal to the number of the windings with opposite winding sense.

In this manner the magnitude of the extent $z_0$ of the coils on the patient side is made smaller than $\sqrt{3}d/4$, whereby d is the cylindrical diameter of the winding.

When using the transverse coil system in accordance with the invention in conjunction with a conventional axial gradient coil system, the symmetric character of the axial conventional gradient system causes the axial extent of said system to project out beyond the asymmetrically arranged and foreshortened transverse gradient coils unless the separation of the conventional axial gradient coils is substantially less than usual. This, in turn, results in the conflicting requirements of maintaining open access through reduction of the total length of the transverse and axial gradient coils while maintaining good axial gradient coil linearity by keeping the partial axial gradient coils sufficiently far apart. Foreshortening the axial conventional symmetric gradient coils in order to prevent them from projecting out beyond the foreshortened asymmetric transverse gradient coils results in poor axial gradient linearity. It is therefore particularly advantageous to utilize the asymmetric axial gradient coils in conjunction with the asymmetric transverse gradient coils. This combination allows for maintenance of the requirement of open access while permitting sufficient linearity of both the axial and transverse gradient fields.

In embodiments of the invention, the transverse gradient coils can be asymmetrically arranged saddle coils with respect to the measurement volume, whereas in other embodiments are, with respect to the measurement volume, asymmetrically arranged streamline shaped coils which correspond to the conventional symmetrically arranged streamline shaped coils depicted in EP-0 320 285 with which an optimization of the coil inductivity n as well as a particularly high linearity of the corresponding field gradient can be achieved.

In a particularly advantageous embodiment of the NMR apparatus in accordance with the invention, a field coil is utilized for the production of the homogeneous magnetic field $B_0$ which exhibits extremely small axial extent such as, by way of example, is described in EP-0 160 350. This so called "slice" field coil with very flat geometrical construction, has a homogeneity region up to the edge of the coil. When utilizing conventional gradient coils for tomographical reasons, this advantage goes largely unused, whereas with the modified asymmetric gradient coils in accordance with the invention the measurement region is taken advantage of up to the edge of the "slice" field coils which by way of example can be of great use in mammography.

Since, when switching the electrical current through the above described asymmetric gradient coils, due to the lack of symmetry with respect to the $z=0$ plane dividing the measurement volume, correspondingly unsymmetric and perturbing eddy currents can establish themselves in the surrounding metal structure of the main field magnets, in a preferred embodiment of the invention, the gradient coils are actively shielded (see by way of example EP-A10 216 590). Towards this end, active shielding coils are arranged about the z axis on a cylinder which exhibits a larger radius than the cylinder containing the gradient coils, whereby the active shielding coils have largely the same symmetry properties as the gradient coils.

When utilizing the asymmetric transverse gradient coils in accordance with the invention, rapid switching of the gradient fields induces, through interaction with the main homogeneous magnetic field, Lorentz forces with these forces generating a torque on the transverse gradient coils. For a symmetric construction of the transverse gradient coils the two partial gradient coil halves, which are symmetric with respect to the central $z=0$ plane, generate torques in equal and opposite directions which, when the partial coil halves are rigidly conected to each other, cancel each other resulting in no net torque on the symmetric transverse gradient coil. However in the asymmetric case, there is no net cancellation of this torque and a large net torque on the asymmetric transverse gradient coil system thereby results. This torque is sufficiently large to present significant mechanical structure and mounting problems for the gradient coil system. However, when the asymmetric transverse gradient coils are used in conjunction with an asymmetric transverse coil active shield, the shielding currents will be in the opposite direction to those flowing in the transverse gradient coil and therefore the resulting torque on the shield will be opposite to that on the asymmetric transverse gradient coil. If the asymmetric transverse coil active shield and the asymmetric transverse gradient coil are rigidly attached to each other, the net torque on the combined system will be cancelled and the net combined mechanical system comprising the axial, the transverse asymmetric gradient coils, and their corresponding active shield will experience no net torque and therefore greatly improved mechanical stability.

In order to achieve a good shielding effect, it is necessary that the axial extent of the shielding coils be larger than the gradient coils themselves and, also in the direction of the patient side. Since, however, the active shielding coils have preferentially a diameter which is larger by approximately a factor of 1.15 to 1.4 than the gradient coils, in this fashion the good properties of the asymmetric gradient coil system in accordance with the invention with regard to the desired reduction of claustrophobia and the improved utilization of the measurement volume are not compromised.

In order to achieve an optimal shielding effect, in a preferred embodiment, the shielding coils are provided with an axial length on both sides of the $z=0$ plane which is larger than that of the gradient coils.

In particular with the utilization of a very flat "slice" field coil the windings of the shielding coils on the patient sided end of the apparatus would thereby, however, project out beyond the axial end of the gradient coil and thereby negate the advantage of the extremely small axial extension.

Preferentially for this case, in one embodiment, the shielding coil windings can be guided at the position $(z=-|Z_0|)$ given by the axial end of the gradient coil in the $z=-|Z_0|$ plane and be radially distributed. The distribution of the windings of the shielding coils in the $z=-|z_0|$ plane as well as in the region $z>-|z_0|$ over the cylinder surface containing the other parts of the shielding coils with radius $R_s$ is to be configured in such a manner that the magnetic field produced thereby through the gradient coils is minimized in the partial region $z>-|z_0|$ at radius $r>R_s$.

In this fashion the patient sided end of the shielding coil which would otherwise project in an axial direction onto the patient is, to a certain extent, radially "bent-off" in the outer direction and no longer impedes the axial access to the measurement volume.

The invention is further described and explained below using the embodiments represented in the drawing. The features which can be derived from the description and the drawing can be applied in other embodiments of the invention individually in and of themselves or collectively in arbitrary combination. Shown are:

DESCRIPTION OF THE PREFERRED EMBODIMENT

Figure 1A:
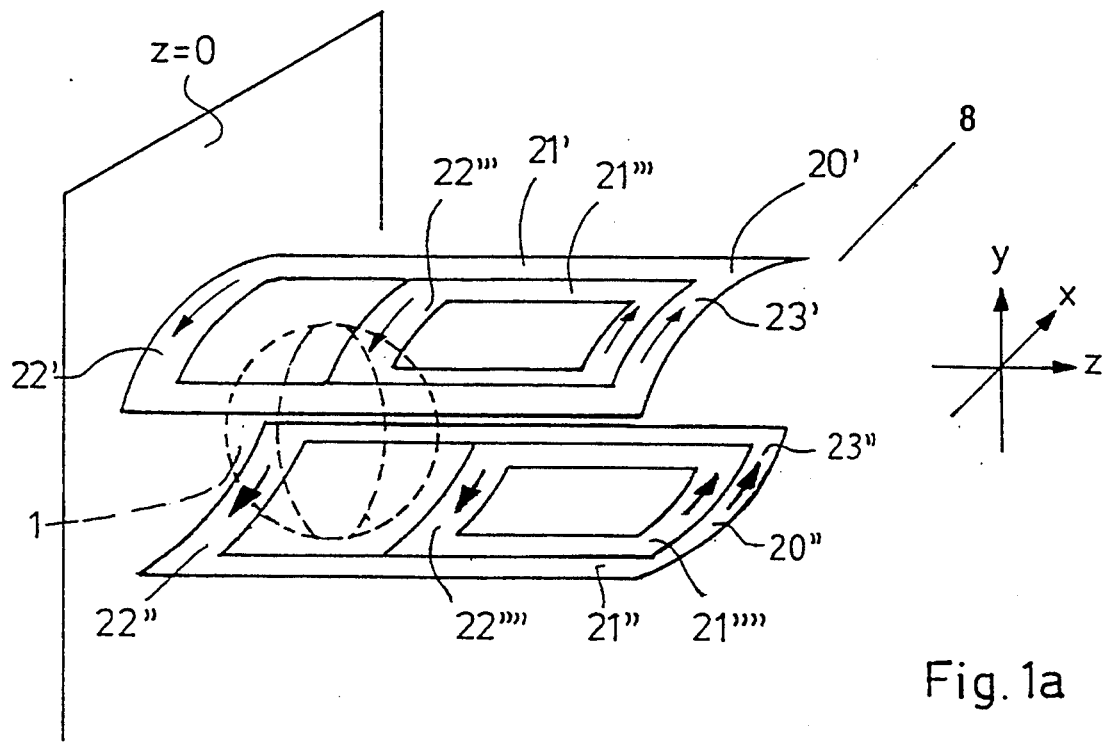
FIG. 1a a schematic representation of the asymmetric saddle gradient coil in accordance with the invention with indicated spherically shaped measurement volume.
Figure 1B:
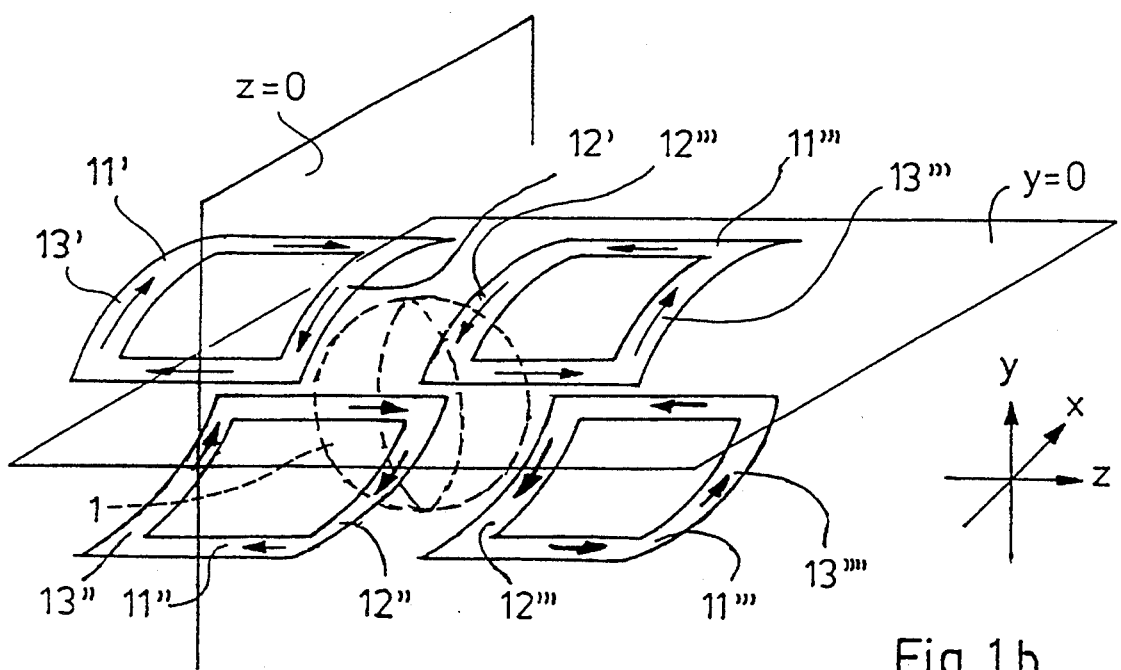
FIG. 1b conventional saddle shaped transverse gradient coils according to prior art.

The schematically represented configuration of FIG. 1b of conventional simple saddle shaped transverse gradient coils exhibits a mirror symmetry of the four partial coils 11', 11'', 11''' and 11'''' with respect to the symmetry planes z=0 and y=0. By means of current flowing in the direction of the arrow, a field gradient, which runs approximately linearly in the y direction, is produced in a measurement volume 1. The measurement volume 1 is approximately defined by a sphere whose center is at the point of intersection of the three symmetry planes Z=0, x=0 and y=0. For the production of the linear transverse field gradient in the measurement volume 1, only the "useful saddle portions" 12', 12'', 12''' and 12'''' contribute, whereas the remaining parts of the partial coils 11', 11'', 11''' and 11'''', in particular those of the "return current saddle parts" 13', 13'', 13''' and 13'''' which are turned away from the measurement volume serve solely to return the current through the partial coils. FIG. 1b clearly shows that the access to the measurement volume 1 in the direction of the z axis is in particular hindered by the return current saddle parts 13', 13'', 13''' and 13'''' which project away in the axial direction from the measurement volume.

In contrast thereto, with the asymmetric configuration of transverse gradient coils 8 in accordance with the invention shown in FIG. 1a, the return current saddle parts 23', 23'' of the associated useful saddle parts 22', 22'' of the partial coils 21', 21'' are folded as seen by the viewers to the right side of the measurement volume 1. Compared to the conventional configuration, the additional partial coils 21''', 21'''', which are likewise arranged on the right side of the z=0 plane remain unchanged. For geometrical reasons the saddle portions of the modified partial coils 21', 21'' surround these unchanged partial coils 21''', 21''''. Thereby, the partial coils 21', 21''' together form a partial coil 20' and the partial coils 21'', 21'''' together a partial coil 20''. In consequence of this the total configuration of the asymmetric transverse gradient coils 8 according to the invention is constructed from solely two partial coils 20', 20'' which lie symmetrically across from another with respect to the y=0 plane. The fact that the useful saddle parts 21', 21'' produce a somewhat different field distribution than that of the somewhat smaller useful saddle portions 22''', 22'''' can be taken into account through differing winding numbers of the corresponding partial coils and through an adapting of the exact axial positions of the saddle portions 21', 21''. In this manner it is possible in measurement volume 1 to produce an approximately linear field gradient dependence. FIG. 1a clearly shows that the axial access to the measurement volume 1 in the z direction at the viewer's left side of the z=0 plane of the configuration is distinctly improved through the "folding away" of the return current saddle portions 23', 23''.

Figure 2A:
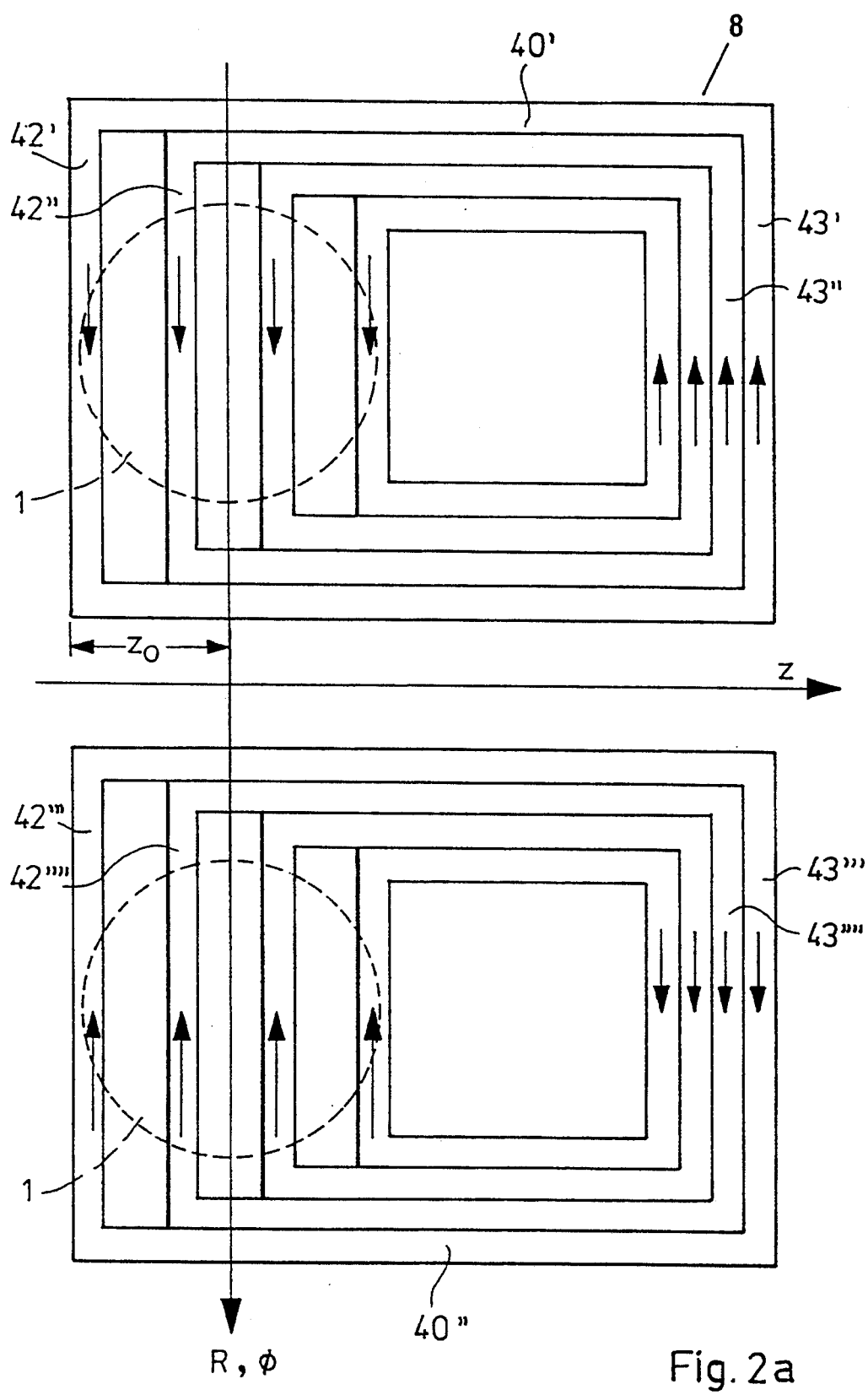
FIG. 2a a flat winding of the double saddle transverse gradient coils in accordance with the invention with indicated position of the measurement volume and arrows in the direction of the current flow.
Figure 2B:
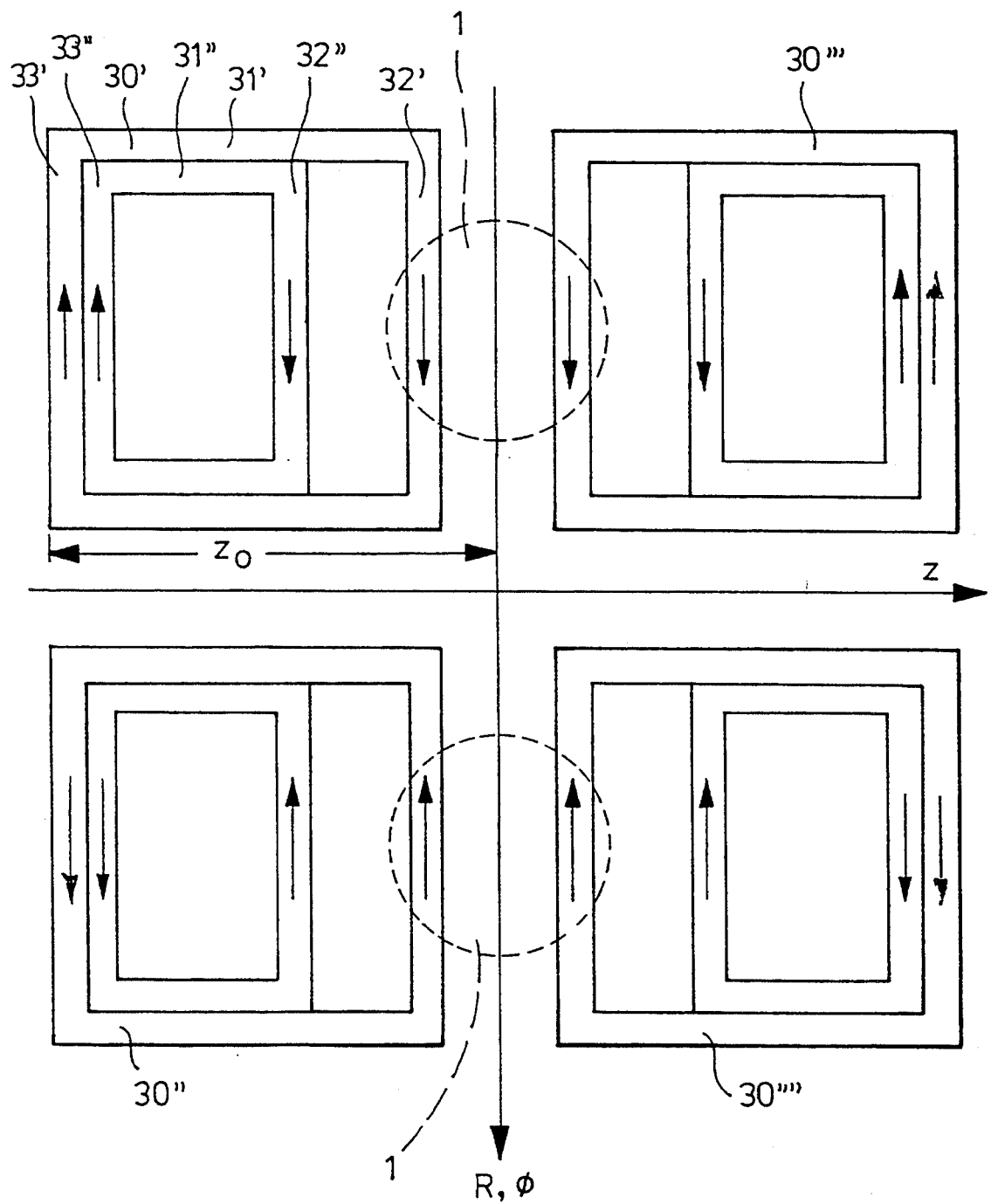
FIG. 2b a winding of a conventional symmetrically arranged double saddle coil according to prior art.

The schematic winding shown in FIG. 2b of a system of four conventional double saddle coils which produce a gradient field of higher linearity than that of the simple saddle coils shown in FIG. 1b, is, for its part, comprised of four partial coils 30', 30'', 30''' and 30''''. The measurement volume 1 is indicated twice in the view. Each of the double saddle coils is composed of a nesting of two partial coils 31', 31'' whose useful saddle portions 32', 32'' are held at an axial separation with respect to each other in the direction of the z axis and contribute, when current is flowing through the coils, to the construction of the transverse magnetic field gradient, whereas the corresponding return current saddle parts 33', 33'' are guided parallel and in proximity to another on the side axially removed from the measurement volume 1.

In contrast, the asymmetric subsystem of transverse gradient coils 8 in accordance with the invention shown in FIG. 2a is comprised of only two oppositely positioned partial coils 40', 40'' in which the useful saddle portions 42', 42'', 42''', 42'''' associated with the return current saddle portions 43', 43'', 43''', 43'''' are folded in the direction of the side of the z=0 plane which is turned away from the useful saddle portions. In this fashion at the observer's left side of the asymmetrical double saddle coils 8 shown in FIG. 2a, a significantly simplified axial access to the measurement volume 1 in the z direction is again given since the separation $z_0$ between the patient sided end of the gradient coil system and the center of the linear investigational region is substantially reduced compared to the conventional system.

Figure 3B:
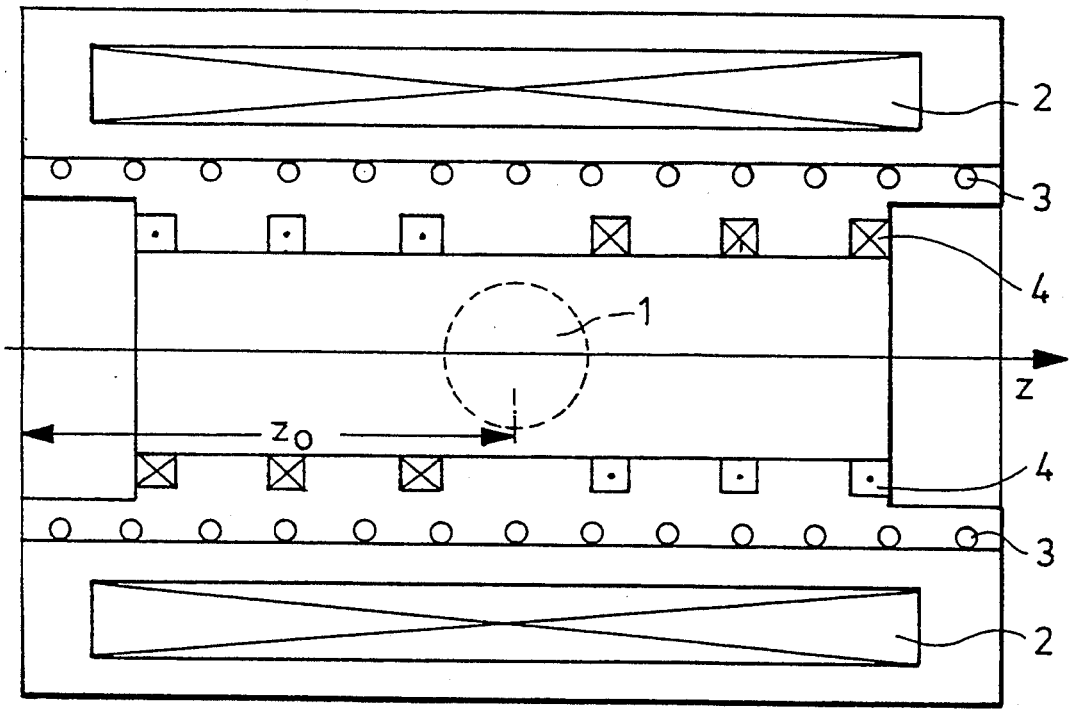
FIG. 3b conventional symmetric gradient coil system according to prior art.
Figure 3A:
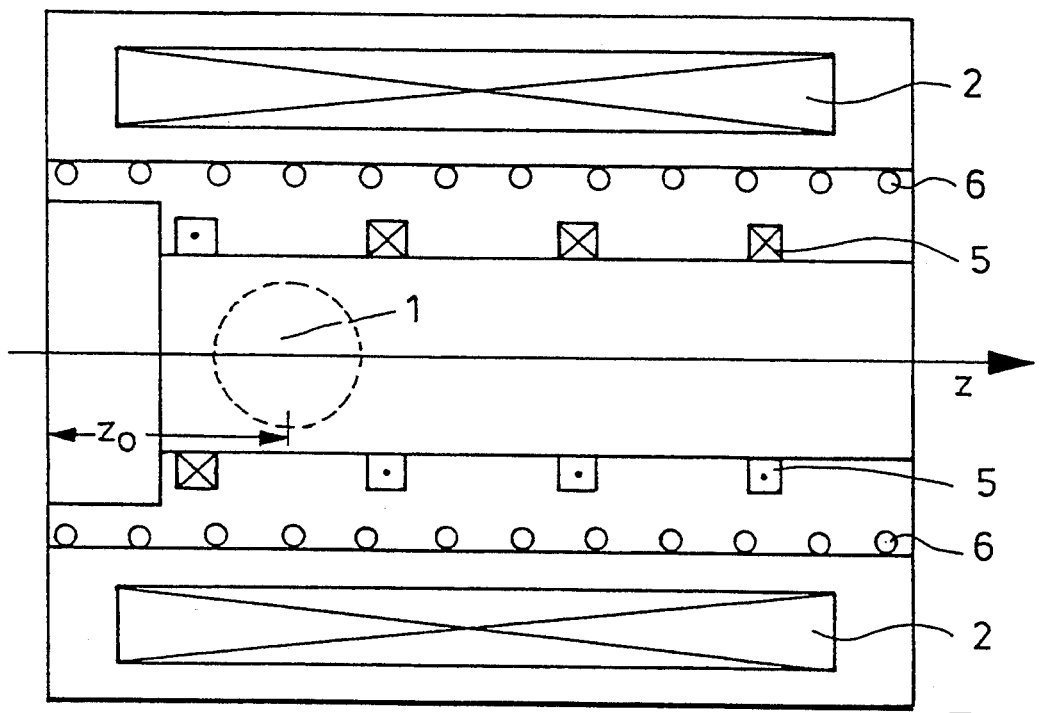
FIG. 3a a vertical cut through the NMR apparatus in the x=0 or y=0 plane with symmetric gradient coil system in accordance with the invention.

The same effect also manifests itself when comparing FIG. 3b, where a conventional NMR system with symmetric gradient coils is schematically represented in transverse cross section, to the system in accordance with the invention of FIG. 3a.

Indicated here are the field coil 2, active shielding coils 3 and 6 each, and in FIG. 3b the symmetric axial gradient coils 4 or in FIG. 3a the modified asymmetric axial gradient coil 5 in accordance with the invention. Here also, for the case of the asymmetric gradient coils, the distance $z_0$ is substantially reduced.

Figure 4A:
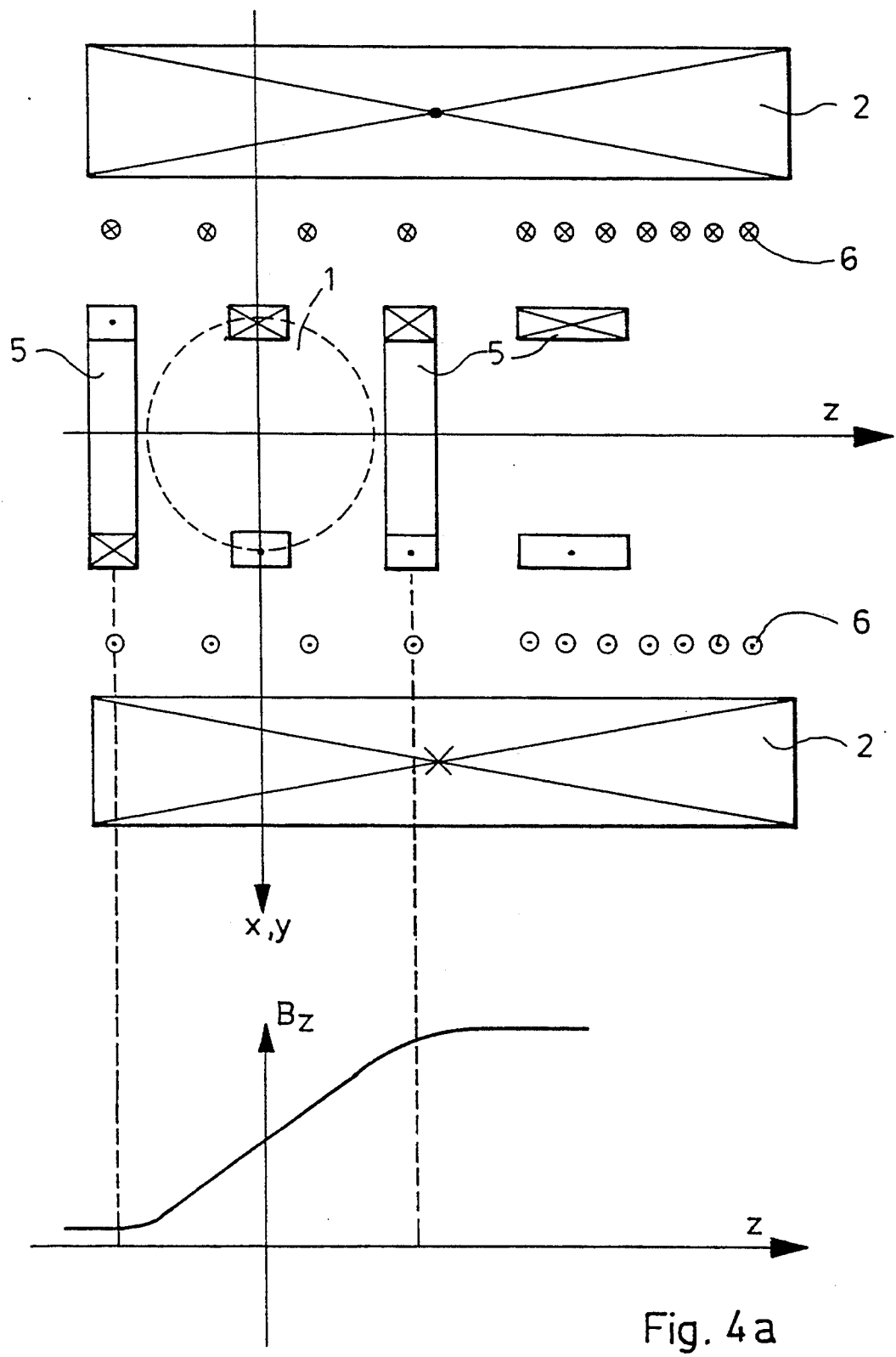
FIG. 4a
above: a schematic cross section through an NMR apparatus in accordance with the invention with asymmetric axial gradient coils,
below: a diagram of the corresponding magnetic field dependence in the direction of the z axis.
Figure 4B:
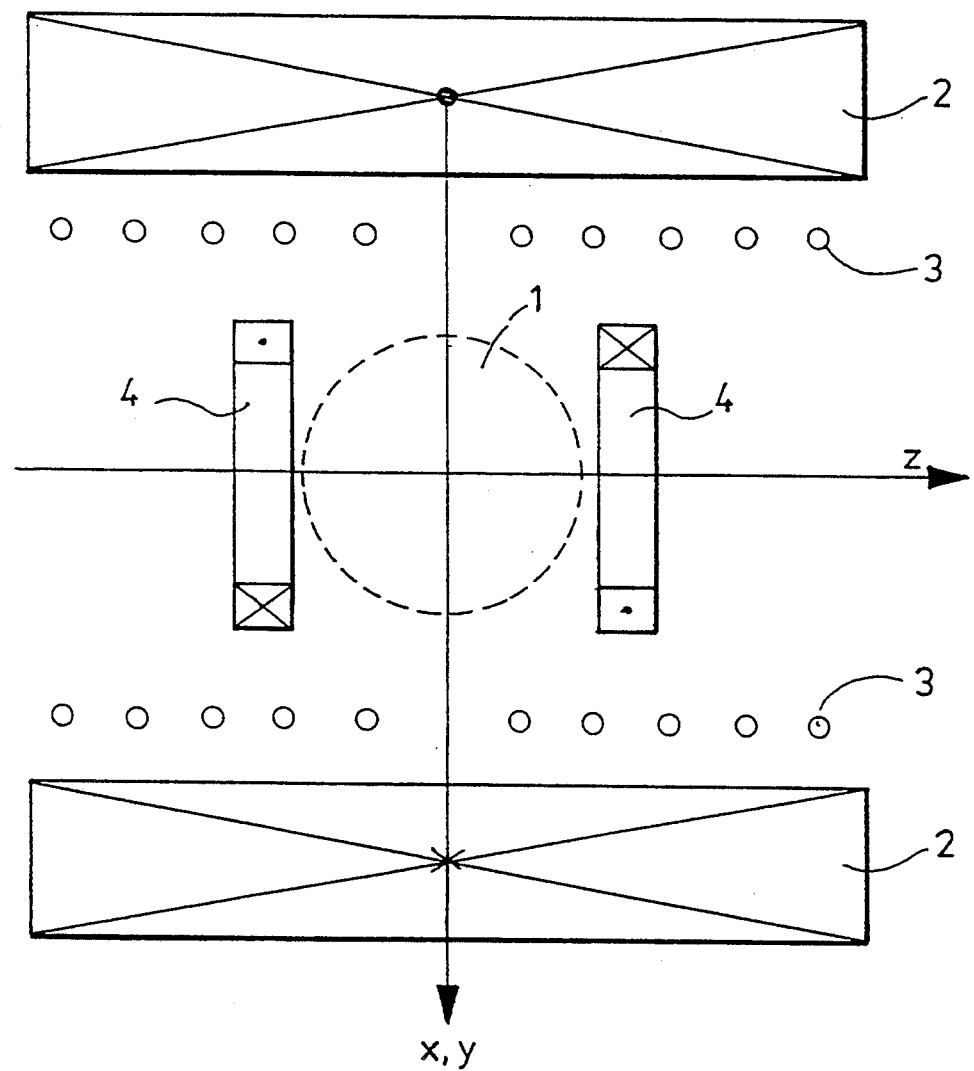
FIG. 4b
above: a vertical cross section through a conventional NMR apparatus
below: schematic of the associated magnetic field dependence.
Figure 4B:
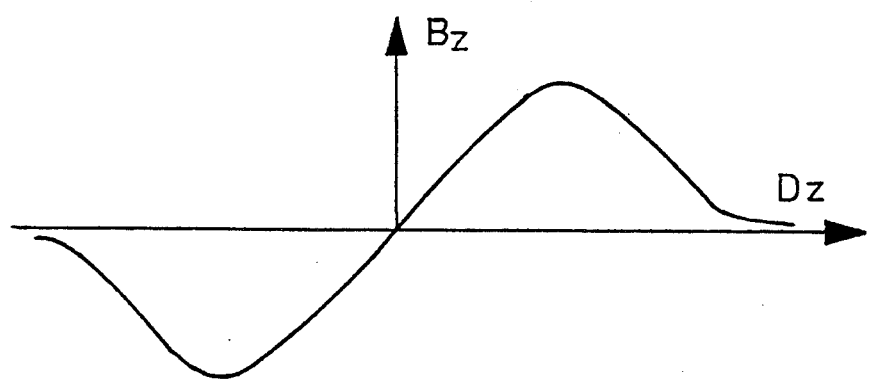

FIG. 4b again shows a schematic vertical section through a conventional NMR apparatus with field coil 2, active shield coils 3 and symmetrically arranged axial gradient coils 4 which enclose a measurement volume 1. Thereby, the anti-symmetric dependence with respect to the z=0 plane of the magnetic field gradients in the direction of the z axis thereby produced are also schematically shown. FIG. 4a on the other hand shows the asymmetric axial gradient coils 5 in accordance with the invention with the associated likewise asymmetrically arranged active shielding coil 6. The corresponding field dependence $B_z(z)$ is no longer anti-symmetric with the respect to the $z=0$ plane, rather is completely unsymmetric. Through corresponding configuration of the windings of the axial gradient coils 5 it is possible to achieve a sufficiently larger region for NMR investigations with only small deviations from ideal linear gradient dependence.

Since the intrinsic property of conventional anti-symmetric axial gradient coils 4 of a vanishing field value of $B_{z=0}$ in the plane $z=0$ is not a requirement for carrying out position selective NMR methods, the properties of the unsymmetric axial gradient coils 5 in accordance with the invention, with regard to a reduction of the distance $z_0$ and/or an improvement in the linearity, lend themselves to further improvement through the realization of a gradient field dependence with the following properties:

In the region of the measurement volume 1 provided for NMR investigations a field dependence of the form $$B_z(z) = B_0 + (B_1/z_1) Z$$

is approximately realized. The coordinate $z=0$ thereby lies approximately in the center of the region provided for NMR investigations. Furthermore $B_0$ and $B_1/z_1$ both have the same sign and $B_1$ approximately equal to $B_0$. It is thereby possible to approximately realize the net field dependence given in the larger portion of FIG. 4a.

Figure 5:
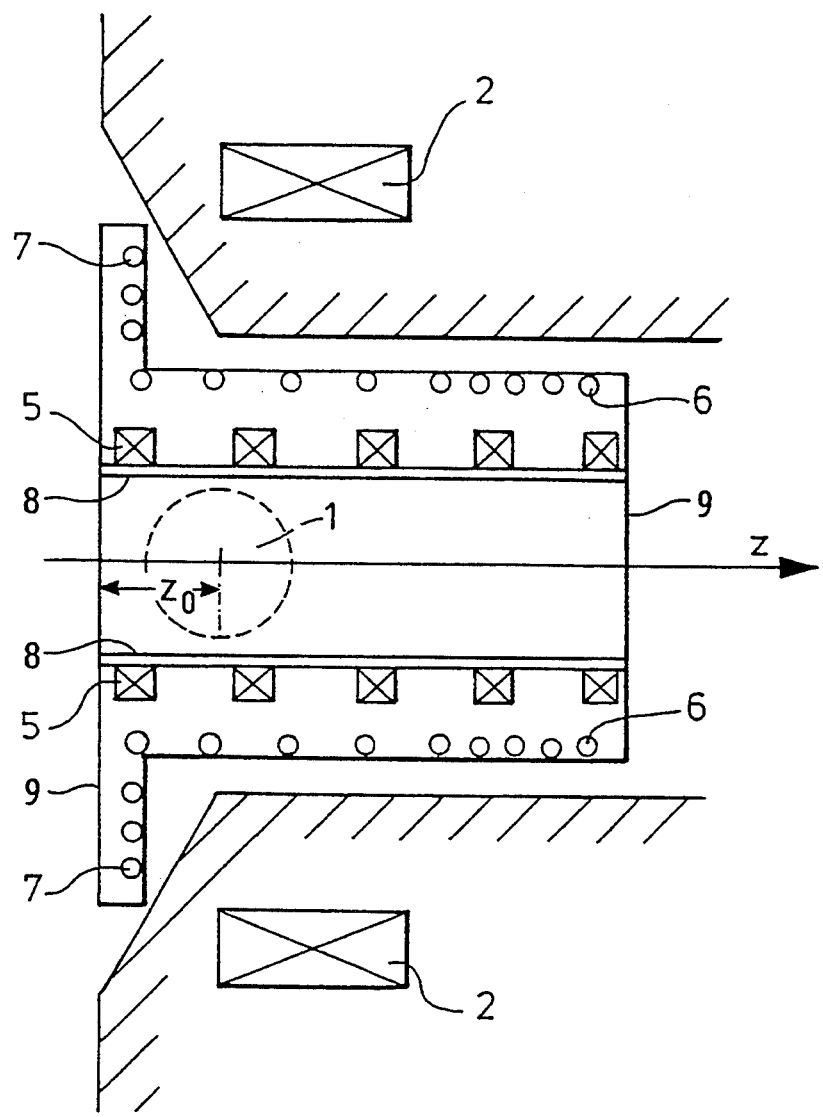
FIG. 5 schematic of a vertical cross section through an NMR apparatus in accordance with the invention with asymmetric gradient coils and patient sided "bent-off" shielding coils.

A further improvement of the apparatus in accordance with the invention is represented in FIG. 5 where the active shielding coils 6 which are matched to the symmetry of the totally unsymmetric axial gradient coils 5 do not, as in conventional coils, project in the z direction beyond the axial gradient coils in the region in proximity to the patient, rather are, in a certain sense, "bent-off" through radial distribution in a plane. Thereby a further improvement of the axial access to the measurement volume 1 or a reduction in the separation $z_0$ results.

In the configuration of FIG. 5 the asymmetric transverse coils 8 are located, by way of example, within the axial asymmetric gradient coils 5. The mountings of the transverse asymmetric gradient coils 8, the axial asymmetric gradient coils 5, and the active shielding coils 6 are so arranged that all three sets of coils are rigidly connected to each other by means of a rigid connector means 9. The gradient coils could be epoxied together into one subsystem and the asymmetric active shielding coils could be epoxied together into a separate subsystem and rigidly attached to each other or the entire system of gradient plus shielding coils could be epoxied together as one solid unit. The rigid connector means 9 assure that the torques generated on the asymmetric transverse gradient coils 8 are cancelled at least partially through the oppositely directed torques on the corresponding active shielding coils 6.

We claim:

1. An apparatus for the production of nuclear magnetic resonance (NMR) comprising:
   (a) a field coil for the production of a homogeneous magnetic field $B_z$ in the direction of a z-axis, said homogeneous field having a measurement volume whose center lies on the z axis;
   (b) a transverse gradient coil for the production of a magnetic field gradient in a direction perpendicular to the z axis, said transverse gradient coil being constructed to be unsymmetric with respect to a $z=0$ plane perpendicular to the z axis through the center of the measurement volume; and
   (c) an axial gradient coil for the production of a magnetic field gradient $G_z$ in the direction of the z axis, said axial gradient coil being arranged cylindrically symmetric with respect to the z axis and unsymmetric with respect to the $z=0$ plane.

2. An apparatus according to claim 1, wherein said transverse gradient coil is, relative to the measurement volume, an asymmetrically arranged saddle coil.

3. An apparatus according to claim 1, wherein said transverse gradient coil relative to the measurement volume, is an asymmetrically arranged streamline coil.

4. An apparatus according to claim 1, wherein said field coil exhibits extremely small axial extent.

5. An apparatus according to claim 1, further comprising:
   (d) active shielding coils, said coils being arranged on a cylindrical surface about the z axis at a larger radius than said transverse and axial gradient coils, with said shielding coils having largely the same symmetry properties as said transverse and axial gradient coils.

6. An apparatus according to claim 5, wherein said shielding coils exhibit a diameter which is larger than that of said gradient coils by a factor of 1.15 to 1.4.

7. An apparatus according to claim 5, wherein said shielding coils are provided to have a larger axial length than said gradient coils on both sides of the $z=0$ plane.

8. An apparatus according to claim 5, wherein the axial extent of said shielding coils on the side of the $z=0$ plane lying away from a point on the z axis at the middle of said field coil is arranged to be at the axial end of said gradient coils, and the windings of said shielding coils are radially distributed at this axial end in a plane.

9. An apparatus according to claim 1, wherein
   (a) said transverse gradient coil produces an at least approximately constant magnetic field gradient within the measurement volume;
   (b) said transverse gradient coil exhibits a subsystem of $G_x$ transverse gradient coils for the production of a magnetic field gradients $G_x$ in the direction of an x axis and a subsystem of $G_y$ transverse gradient coils for the production of a magnetic field gradient $G_y$ in the direction of a y axis, with the x, y, and z axes being mutually perpendicular to each other and intersecting at the center of the measurement volume;
   (c) said $G_x$ transverse gradient coils are largely mirror symmetric to the $x=0$ plane and said $G_y$ transverse gradient coils are largely mirror symmetric to the $y=0$ plane;
   (d) said transverse coil consists essentially of two partial coils whose windings each have the same direction; and
   (e) said axial gradient coil comprises a first and a second partial coil arranged on opposite sides of the $z=0$ plane, with said first partial coil exhibiting largely the opposite winding direction than said second partial coil and the number of windings of said first partial coil is unequal to the number of windings of said second partial coil.

10. An apparatus according to claim 9, wherein said transverse gradient coil is, relative to the measurement volume, an asymmetrically arranged saddle coil.

11. An apparatus according to claim 9, wherein said transverse gradient coil, relative to the measurement volume, is an asymmetrically arranged streamline coil.

12. An apparatus according to claim 9, wherein said field coil exhibits extremely small axial extent.

13. An apparatus according to claim 9, further comprising active shielding coils, and coils being arranged on a cylindrical surface about the z axis at a larger radius than said transverse and axial gradient coils, said shielding coils having largely the same symmetry properties as said gradient coils.

14. An apparatus according to claim 13, wherein said shielding coils exhibit a diameter which is larger than that of said gradient coils by a factor of 1.15 to 1.4.

15. An apparatus according to claim 13, wherein said shielding coils are provided to have a larger axial length than said gradient coils on both sides of the $z=0$ plane.

16. An apparatus according to claim 13, wherein the axial extent of said shielding coils on the side of the $z=0$ plane lying away from a point on the z axis at the middle of said field coil is arranged to be at the axial end of said gradient coils, and the windings of said shielding coils are radially distributed at this axial end in a plane.

* * * * *